(12) United States Patent
Yoshida et al.

(10) Patent No.: US 8,791,031 B2
(45) Date of Patent: Jul. 29, 2014

(54) METHOD OF MANUFACTURING SEMICONDUCTOR DEVICE, METHOD OF PROCESSING SUBSTRATE AND SUBSTRATE PROCESSING APPARATUS

(71) Applicant: Hitachi Kokusai Electric Inc., Tokyo (JP)

(72) Inventors: Hidenari Yoshida, Toyama (JP); Tomoshi Taniyama, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/963,695

(22) Filed: Aug. 9, 2013

(65) Prior Publication Data

US 2014/0045278 A1 Feb. 13, 2014

(30) Foreign Application Priority Data

Aug. 10, 2012 (JP) .................. 2012-178640

(51) Int. Cl.
*H01L 21/31* (2006.01)
*C23C 16/00* (2006.01)
(52) U.S. Cl.
USPC ............ 438/758; 438/761; 438/778; 118/715
(58) Field of Classification Search
USPC ................ 438/758, 761, 763, 778, 779, 782; 118/715, 722
See application file for complete search history.

(56) References Cited

U.S. PATENT DOCUMENTS

| 7,795,157 | B2 * | 9/2010 | Terasaki et al. | ............... 438/758 |
| 2005/0028738 | A1 * | 2/2005 | Saito et al. | .................. 118/724 |
| 2013/0137279 | A1 * | 5/2013 | Yamamoto et al. | ........... 438/778 |

FOREIGN PATENT DOCUMENTS

| JP | 2009-117534 | 5/2009 |
| JP | 2011-044446 | 3/2011 |

* cited by examiner

*Primary Examiner* — Kevin M Picardat
(74) *Attorney, Agent, or Firm* — Edell, Shapiro & Finnan, LLC

(57) ABSTRACT

A method of manufacturing a semiconductor device includes: (a) supplying a first process gas from a first process gas supply unit into a process chamber via a flow rate control device to form a film on a substrate; (b) transmitting a signal representing an exhaust pressure detected by a pressure detector to a controller after the first process gas is supplied into the process chamber; (c) controlling a pressure adjustor and the flow rate control device once the signal is received by the controller such that the exhaust pressure reaches a predetermined pressure; (d) supplying a purge gas from a purge gas supply unit into the process chamber to purge an inside atmosphere after forming the first film; and (e) supplying a second process gas from a second process gas supply unit into the process chamber via the flow rate control device to form a second film.

10 Claims, 11 Drawing Sheets

METHOD OF MANUFACTURING SEMICONDUCTOR DEVICE, METHOD OF PROCESSING SUBSTRATE AND SUBSTRATE PROCESSING APPARATUS

CROSS REFERENCE TO RELATED APPLICATIONS

This application claims foreign priority under 35 U.S.C. §119(a)-(d) to Application No. JP 2012-178640 filed on Aug. 10, 2012, entitled "Method of Manufacturing Semiconductor Device, Method of Processing Substrate and Substrate Processing Apparatus," the entire contents of which are hereby incorporated by reference.

FIELD OF THE INVENTION

The present invention relates to a method of manufacturing a semiconductor device capable of processing a semiconductor wafer, a substrate processing method, and a substrate processing apparatus.

BACKGROUND

In relation to technology regarding substrate processing apparatuses, a vertical heat treatment apparatus has been known as an apparatus in which a receiving container in which a plurality of substrates are accommodated is placed in a main body of a substrate processing apparatus. In general, in the vertical heat treatment apparatus, a plurality of substrates are transferred into the apparatus while being accommodated in the receiving container and several tens to several hundreds of substrates are simultaneously processed through a one-time process (see, for example, Japanese Unexamined Patent Application Publication No. 2009-117534).

For example, the number of wafers that can be processed by a vertical heat treatment apparatus corresponding to a 450 mm wafer is equal to the number of wafers that can be processed by a vertical heat treatment apparatus corresponding to a 300 mm wafer. However, when a wafer (substrate) has a large diameter, for example, when a 450 mm wafer is used instead of a 300 mm wafer, the sizes of members such as a receiving container or a reaction furnace should also be increased, thereby increasing the overall size of the vertical heat treatment apparatus. Thus, it takes a more time for the vertical heat treatment apparatus corresponding to the 450 mm wafer to process wafers in the same process as in the vertical heat treatment apparatus corresponding to the 300 mm wafer, thereby lowering the throughput.

SUMMARY

It is an object of the present invention to provide a method of manufacturing a semiconductor device, a substrate processing method, and a substrate processing apparatus, which are capable of suppressing a decrease in throughput when a substrate has a large diameter.

According to one aspect of the present invention, there is provided a method of manufacturing a semiconductor device using a substrate processing apparatus comprising a process chamber configured to process a substrate, a first process gas supply unit configured to supply a first process gas for forming a first film on the substrate, a second process gas supply unit configured to supply a second process gas for forming a second film on the first film, a purge gas supply unit configured to supply a purge gas for purging an atmosphere in the process chamber, a flow rate control device configured to control flow rates of the first process gas, the second process gas and the purge gas, an exhaust device configured to exhaust the process chamber, a pressure detector installed at the exhaust device to detect an exhaust pressure, a pressure adjustor configured to adjust an inside pressure of the process chamber and a controller connected to at least the pressure detector, the pressure adjustor and the flow rate control device, and configured to control the pressure adjustor and the flow rate control device based on the exhaust pressure detected by the pressure detector, the method comprising: (a) supplying the first process gas from the first process gas supply unit into the process chamber via the flow rate control device to form the film on the substrate; (b) transmitting a signal representing the exhaust pressure detected by the pressure detector to the controller after the first process gas is supplied into the process chamber; (c) controlling the pressure adjustor and the flow rate control device once the signal is received by the controller such that the exhaust pressure reaches a predetermined pressure; (d) supplying the purge gas from the purge gas supply unit into the process chamber after forming the first film; and (e) supplying the second process gas from the second process gas supply unit into the process chamber via the flow rate control device to form the second film on the first film.

According to another aspect of the present invention, there is provided a substrate processing method using a substrate processing apparatus comprising a process chamber configured to process a substrate, a first process gas supply unit configured to supply a first process gas for forming a first film on the substrate, a second process gas supply unit configured to supply a second process gas for forming a second film on the first film, a purge gas supply unit configured to supply a purge gas for purging an atmosphere in the process chamber, a flow rate control device configured to control flow rates of the first process gas, the second process gas and the purge gas, an exhaust device configured to exhaust the process chamber, a pressure detector installed at the exhaust device to detect an exhaust pressure, a pressure adjustor configured to adjust an inside pressure of the process chamber and a controller connected to at least the pressure detector, the pressure adjustor and the flow rate control device, and configured to control the pressure adjustor and the flow rate control device based on the exhaust pressure detected by the pressure detector, the method comprising: (a) supplying the first process gas from the first process gas supply unit into the process chamber via the flow rate control device to form the film on the substrate; (b) transmitting a signal representing the exhaust pressure detected by the pressure detector to the controller after the first process gas is supplied into the process chamber; (c) controlling the pressure adjustor and the flow rate control device once the signal is received by the controller such that the exhaust pressure reaches a predetermined pressure; (d) supplying the purge gas from the purge gas supply unit into the process chamber to purge an inside atmosphere after forming the first film; and (e) supplying the second process gas from the second process gas supply unit into the process chamber via the flow rate control device to form the second film on the first film.

According to another aspect of the present invention, there is provided a substrate processing apparatus comprising: a process chamber configured to process a substrate; a first process gas supply unit configured to supply a first process gas for forming a first film on the substrate; a second process gas supply unit configured to supply a second process gas for forming a second film on the first film; a purge gas supply unit configured to supply a purge gas for purging an atmosphere in the process chamber; a flow rate control device configured to control flow rates of the first process gas, the second process gas and the purge gas; an exhaust device configured to exhaust the process chamber; a pressure detector installed at the exhaust device to detect an exhaust pressure; a pressure adjustor configured to adjust an inside pressure of the process chamber; and a controller connected to at least the pressure detector, the pressure adjustor and the flow rate control device and configured to control the pressure adjustor and the flow rate control device based on the exhaust pressure detected by the pressure detector.

DETAILED DESCRIPTION

Opinions of the Inventors

The inventors of the present invention have found the following problems through repetitive research. The inside of a process chamber should be rapidly controlled to have a predetermined pressure by supplying a source gas or exhausting the inside of the process chamber so as to improve the throughput, in a substrate processing method in which steps of supplying a first source gas onto the substrate in the process chamber, exhausting the first source gas remaining in the process chamber via an exhaust line while suspending the supply of the first source gas, supplying a second source gas onto the substrate in the process chamber, and exhausting the second source gas remaining in the process chamber via the exhaust line while suspending the supply of the second source gas process chamber are repeatedly performed a plurality of times to form a thin film on the substrate. When a substrate that is to be processed has a large diameter, the volume in the process chamber increases and the flow rate of a gas supplied increases. Thus, if the flow rate of a gas is controlled using a mass flow controller (MFC) configured to control the flow rate of a supply gas in order to maintain pressure in the process chamber at a constant level, overshoot is likely to occur when a timing of controlling the flow rate is excessively late, and undershoot is likely to occur when a timing of controlling the flow rate is excessively early.

The present invention is based on the opinions of the inventors of the present invention described above.

First Embodiment

Figure 1:
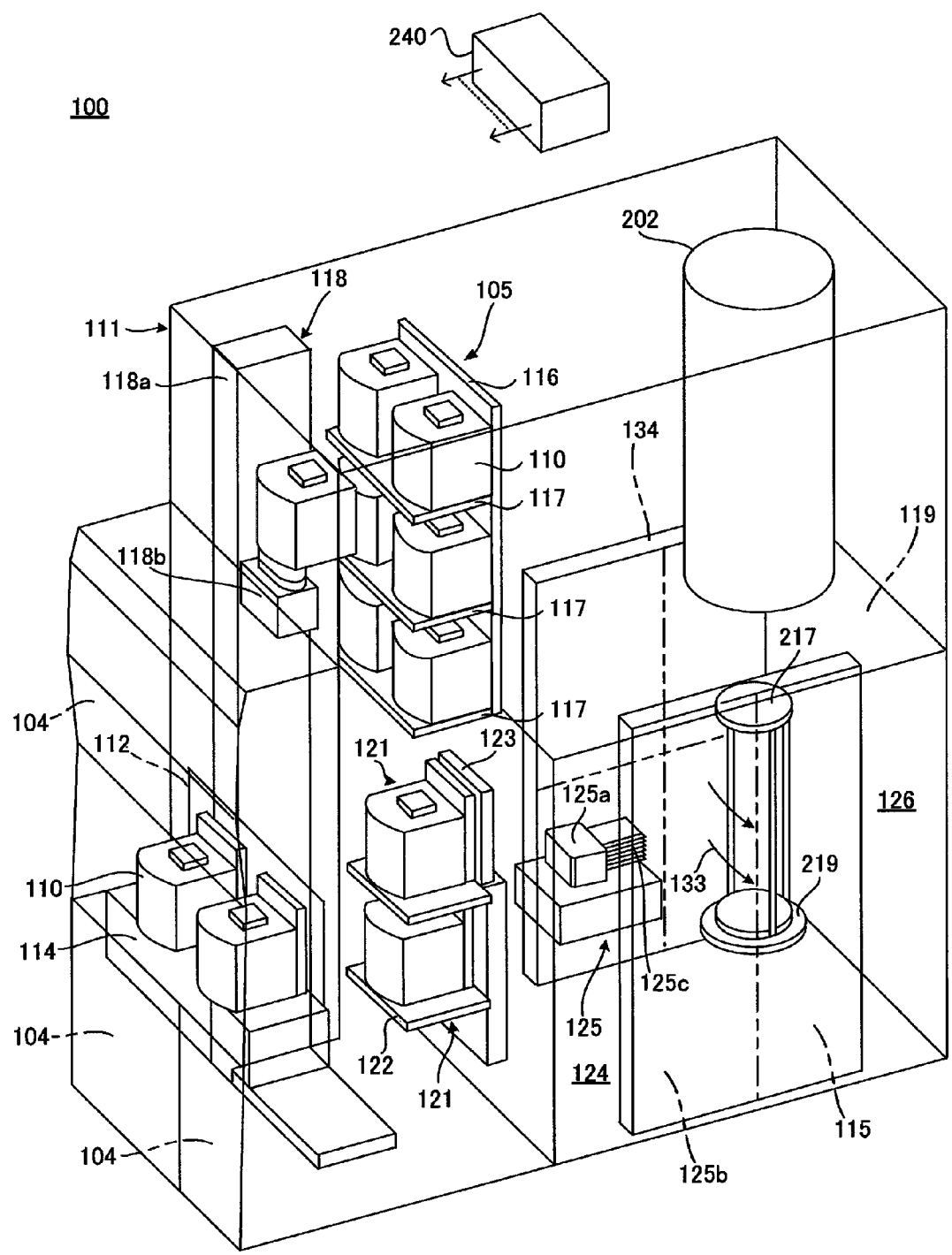
FIG. 1 is an oblique perspective view of a substrate processing apparatus according to an embodiment of the present invention.
Figure 2:
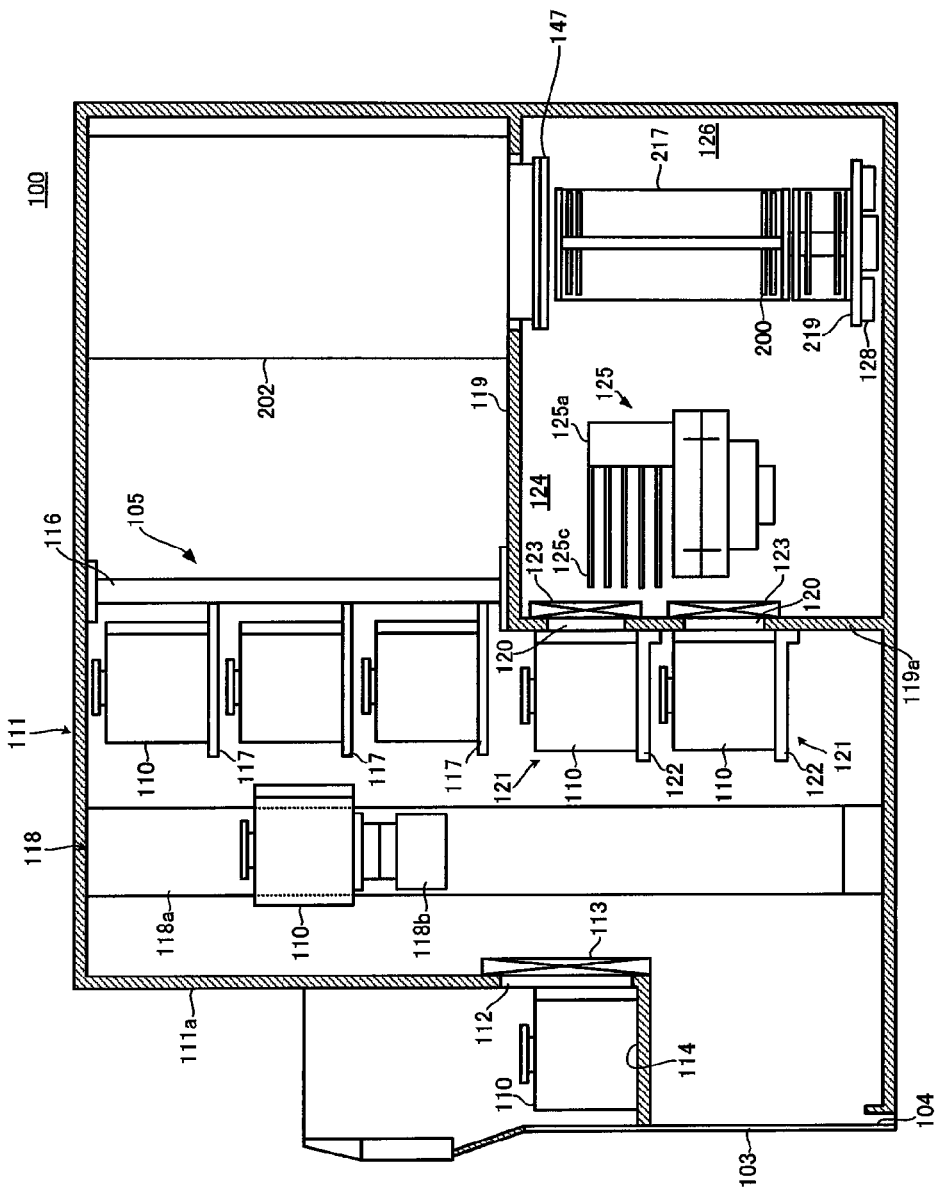
FIG. 2 is a cross-sectional view of a substrate processing apparatus according to an embodiment of the present invention.

A first embodiment of the present invention will now be described with reference to the accompanying drawings. A substrate processing apparatus according to an embodiment of the present invention is embodied as, for example, a semiconductor manufacturing apparatus configured to run a processing apparatus for performing a method of processing a semiconductor device (integrated circuit (IC)). Also, in the present disclosure, a case in which a vertical apparatus that performs oxidation, a diffusion treatment, etc., on a substrate is applied as a substrate processing apparatus (hereinafter referred to simply as a 'processing apparatus') will be described. FIG. 1 is an oblique perspective view of a substrate processing apparatus according to an embodiment of the present invention. FIG. 2 is a cross-sectional view of the substrate processing apparatus according to an embodiment of the present invention.

As illustrated in FIGS. 1 and 2, a substrate processing apparatus 100, in which a plurality of wafers (substrates) 200 formed of silicon are accommodated and a FOUP 110 (hereinafter referred to as a 'pod') is used as a wafer carrier serving as a receiving container, includes a housing 111 used as a main body of the substrate processing apparatus 100.

At the front of a front wall 111a of the housing 111, a front maintenance opening 103 is formed as an opening via which maintenance may be performed. A front maintenance door 104 is installed to open/close the front maintenance opening 103. On the front wall 111a of the housing 111, a pod loading/unloading port 112 is installed to communicate with the inside/outside the housing 111. The pod loading/unloading port 112 is configured to be opened/closed by a front shutter 113. A load port 114 serving as a loading/unloading unit is installed at the front of the pod loading/unloading port 112. The load port 114 is configured to place and position the pod 110 thereon. The pod 110 is configured to be loaded on the load port 114 and to be unloaded from the load port 114 by an in-process transfer device (not shown).

A pod shelf 105 (receiving shelf) is installed upward on a roughly central portion in the housing 111. The pod shelf 105 includes a support unit 116 installed vertically, and a multi-stage placing unit 117 vertically supported, for example, at upper, middle, and lower portions of the support unit 116, to be independently movable. The pod shelf 105 is configured to support a plurality of pods 110 while the plurality of pods 110 are placed on the multi-stage placing unit 117. That is, in the pod shelf 105, a plurality of pods 110 are accommodated vertically in a multi-stage manner such that, for example, every two pods 110 are arranged in a line in the same direction.

In the housing 111, a pod transfer device 118 (receiving container transfer device) is installed between the load port 114 and the pod shelf 105. The pod transfer device 118 includes a pod elevator 118a which is an axis unit configured to be moved vertically while retaining the pod 110, and a pod transfer unit 118b which is a transfer unit configured to vertically transfer the pod 110 while having the pod 110 therein.

The pod transfer device 118 is configured to transfer the pod 110 among the load port 114, the pod shelf 105, and a pair of pod openers 121 through continuous operations of the pod elevator 118a and the pod transfer unit 118b.

A sub housing 119 is installed at the inner bottom of the housing 111, ranging from a roughly central portion between the front and back of the housing 111 to a rear end of the housing 111. A pair of wafer loading/unloading ports 120 configured to transfer the wafer 200 inside/outside the sub housing 119 are, for example, vertically installed on upper and lower portions of a front wall 119a of the sub housing 119. The pair of pod openers 121 are installed at the wafer loading/unloading ports 120 on the upper and lower portions of the front wall 119a, respectively. The pair of pod openers 121 each include one of a pair of placing tables 122 on which the pod 110 is placed, and one of a pair of cap attaching/detaching mechanisms 123 configured to attach/detach a cap of the pod 110 serving as a sealing member. Each of the pair of pod openers 121 is configured to open/close a wafer entrance of the pod 110 by attaching/detaching the cap of the pod 110 placed on the placing table 122 with the cap attaching/detaching mechanism 123.

In the sub housing 119, a transfer chamber 124 is formed to be fluidically insulated from a space in which the pod transfer device 118 or the pod shelf 105 is installed. In the transfer chamber 124, a wafer transfer mechanism 125 is installed in a front region of the transfer chamber 124. The wafer transfer mechanism 125 includes a wafer transfer device 125a configured to horizontally rotate or straightly move the wafer 200, and a wafer transfer device elevator 125b configured to move the wafer transfer device 125a upward/downward. As schematically illustrated in FIG. 1, the wafer transfer device elevator 125b is installed between a pressure-resistant right end of the housing 111 and a front right end of the transfer chamber 124 in the sub housing 119. Tweezers 125c of the wafer transfer device 125a (substrate holding members) are configured to load the wafer 200 into a boat 217 (substrate retainer) serving as a wafer placing unit, or unload the wafer 200 from the boat 217 through continuous operations of the wafer transfer device elevator 125b and the wafer transfer device 125a.

A waiting position 126 is installed at the back of the transfer chamber 124 to accommodate the boat 217 that waits to be processed. A process furnace 202 serving as a process chamber is installed above the waiting position 126. A bottom end portion of the process furnace 202 is configured to be opened/closed by a furnace port shutter 147. Although not shown, a spare room (load lock chamber) may be installed to encompass the waiting position 126 right below the process furnace 202 if needed (e.g., when an oxygen concentration is reduced under wafer process conditions, etc.), and the oxygen concentration may be reduced previously or the wafer 200 that is substrate-processed may be cooled.

As schematically illustrated in FIG. 1, a boat elevator 115 is installed between the pressure-resistant right end of the housing 111 and the right end of the waiting position 126 in the sub housing 119 to move the boat 217 upward/downward. A seal cap 219 serving as a lid is horizontally installed on an arm 128 serving as a connector connected to a platform of the boat elevator 115. The seal cap 219 is configured to vertically support the boat 217 to seal the bottom end portion of the process furnace 202. The seal cap 219 includes a plurality of retaining members, and is configured to horizontally support a plurality of wafers 200 (e.g., about 25 to 200 wafers 200) so that the plurality of wafers 200 are concentrically aligned in a vertical direction.

As schematically illustrated in FIG. 1, a clean unit 134 which includes a supply fan and a dustproof filter is installed at a side of the transfer chamber 124 facing the wafer transfer device elevator 125b and a left end of the transfer chamber 124 opposite to the boat elevator 115 so as to supply clean air 133 (e.g., a clean atmosphere or an inert gas). A notch alignment device (not shown) serving as a substrate matching device for adjusting the location of the wafer 200 in a cylindrical direction is installed between wafer transfer device 125a and the clean unit 134. The clean air 133 blown out of the clean unit 134 circulates around the notch alignment device (not shown), the wafer transfer device 125a, and the boat 217 in the waiting position 126, is absorbed by a duct (not shown) to be exhausted outside the housing 111 or is circulated to a first side (supply side) which is an absorbing side of the clean unit 134, and is then blown out to the transfer chamber 124 again via the clean unit 134.

Figure 3:
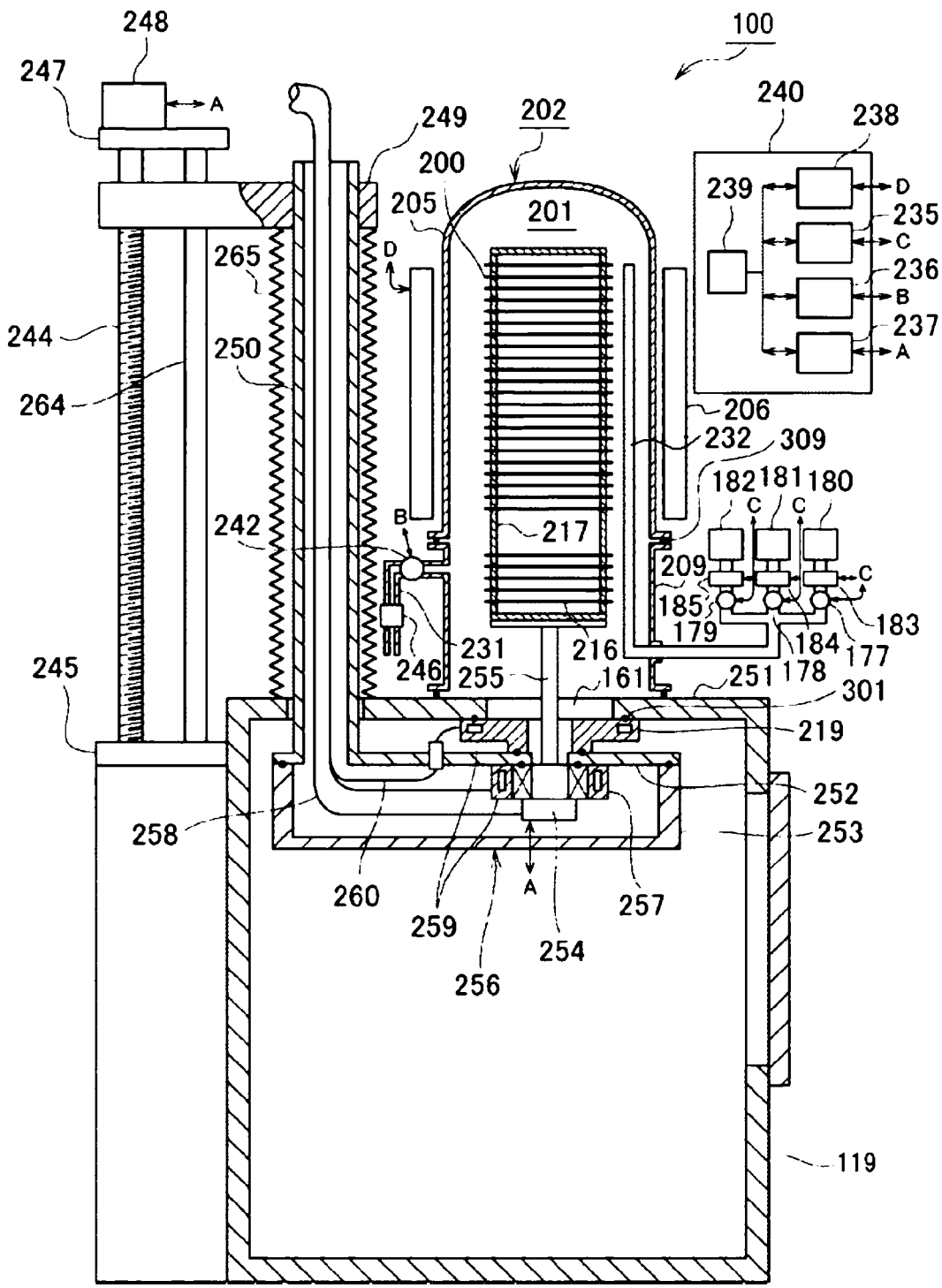
FIG. 3 is a schematic cross-sectional view of a process furnace of a substrate processing apparatus and the periphery of the process furnace according to an embodiment of the present invention.

Next, operations of the substrate processing apparatus 100 will be described. In the following description, operations of elements of the substrate processing apparatus 100 are controlled by a controller 240. FIG. 3 is a schematic longitudinal cross-sectional view of the process furnace 202 of the substrate processing apparatus 100 and the periphery of the process furnace 202 according to an embodiment of the present invention. Each of a temperature controller 238, a gas flow rate controller 235, a pressure controller 236, and a driving controller 237 included in the controller 240 includes a manipulation unit (not shown) and an input/output (I/O) unit (not shown), and is electrically connected to a main controller 239 that controls the entire substrate processing apparatus 100. The gas flow rate controller 235, the pressure controller 236, the driving controller 237, the temperature controller 238, and the main controller 239 collectively form the controller 240. For example, the controller 240 controls the driving controller 241 to control the pod transfer device 118, the pod shelf 105, the wafer transfer mechanism 125, the boat elevator 115, etc.

As illustrated in FIGS. 1 and 2, when the pod 110 is supplied to the load port 114, the pod loading/unloading port 112 is opened by the front shutter 113. Then, the pod 110 placed on the load port 114 is loaded from the pod loading/unloading port 112 into the housing 111 by the pod transfer device 118. The pod 110 loaded into the housing 111 is automatically transferred to the multi-stage placing unit 117 of the pod shelf 105 by the pod transfer device 118, is temporarily stored on the multi-stage placing unit 117, is transferred to one of the pair of pod openers 121 from the pod shelf 105, and is then transferred onto the placing table 122 or directly transferred to the pod opener 121 to be placed on the placing table 122. In this case, the wafer loading/unloading port 120 of the pod opener 121 is sealed by the cap attaching/detaching mechanism 123, and the clean air 133 flows into the transfer chamber 124 such that the transfer chamber 124 is filled with the clean air 133. For example, by filling the transfer chamber 124 with the clean air 133 which is nitrogen gas, the transfer chamber 124 is set to have an oxygen concentration of 20 ppm or less, which is significantly lower than an oxygen concentration in the housing 111 having an air atmosphere.

An opening-side end face of the pod 110 placed on the placing table 122 is pressed against an opening periphery section of the wafer loading/unloading port 120 at the front wall 119a of the sub housing 119. Then, the cap of the pod 110 is detached by the cap attaching/detaching mechanism 123 to open the wafer entrance. When the pod 110 is opened by the pod opener 121, the wafer 200 is picked up from the pod 110 via the wafer entrance by the tweezers 125c of the wafer transfer device 125a. Thereafter, the wafer 200 is controlled using the notch alignment device (not shown), loaded into the waiting position 126 at the rear of the transfer chamber 124, and then loaded (charged) into the boat 217. After loading the wafer 200 into the boat 217, the wafer transfer device 125a returns to the pod 110 and loads a next wafer 200 into the boat 217.

While the wafer 200 is loaded into the boat 217 from one of the pod openers 121, e.g., the upper or lower pod opener 121, by the wafer transfer mechanism 125, another pod 110 is transferred to and placed on the other pod opener 121 (the lower or upper pod opener 121) from the pod shelf 105 by the pod transfer device 118. The pod 110 is opened by the pod opener 121 simultaneously with the loading of the wafer 200.

When a predetermined number of wafers 200 are loaded into the boat 217, the bottom end portion of the process furnace 202 sealed by the furnace port shutter 147 is opened by the furnace port shutter 147. Then, by raising the seal cap 219 by the boat elevator 115, the boat 217 retaining the group of wafers 200 is loaded into the process furnace 202.

After the loading of the boat 217, an arbitrary predetermined process is performed on the wafers in the process furnace 202. Thereafter, the wafers 200 and the pod 110 are unloaded from the housing 111 in an order that is the reverse of the order of the above-described operations, except for the wafer alignment using the notch alignment device.

Next, the structures of the process furnace 202 of the substrate processing apparatus 100 and the periphery of the process furnace 202 will be described. As illustrated in FIG. 3, the process furnace 202 includes a heater 206 serving as a heating mechanism. The heater 206 has a cylindrical shape, includes a heater wire and an insulating member installed around the heater wire, and is vertically installed while being supported by a retaining body (not shown).

An outer tube 205 serving as a reaction tube is installed in the heater 206 concentrically with the heater 206. The outer tube 205 is formed of a heat-resistant material such as quartz ($SiO_2$) or silicon carbide (SiC), and has a cylindrical shape, the top end of which is closed and a bottom end of which is open. The process chamber 201 is formed in a hollow tubular portion of the outer tube 205, and is configured to accommodate a plurality of wafers 200 which are substrates in a state in which the plurality of wafers 20 are vertically arranged in a multi-stage in a horizontal posture using the boat 217.

A manifold 209 is installed below the outer tube 205 to be concentrically formed with the outer tube 205. The manifold 209 is formed of, for example, stainless steel or the like, and has a cylindrical shape, the top and bottom ends of which are open. The manifold 209 is installed to support the outer tube 205. Also, an O-ring 309 serving as a seal member is installed between the manifold 209 and the outer tube 205. By supporting the manifold 209 with a retaining body (not shown), the outer tube 205 is vertically installed. The process tube 203 and the manifold 209 form a reaction container together.

A gas exhaust pipe 231 is installed at the manifold 209 and a gas supply pipe 232 (gas supply nozzle) is installed to pass through the manifold 209. The gas supply pipe 232 is installed in an arc-shaped space between an inner wall of the process furnace 202 and the wafer 200 to move from a lower portion of the inner wall of the process furnace 202 upward along an upper portion of the inner wall of the process furnace 202 in a direction in which the wafers 200 are stacked. Also, the gas supply pipe 232 is divided into, for example, three parts at an upstream side, and the three parts of the gas supply pipe 232 are connected to a first gas supply source 180, a second gas supply source 181, and a third gas supply source 182 via valves 177, 178, and 179 and MFCs 183, 184, and 185 serving as gas flow rate control devices, respectively. The MFCs 183, 184, and 185 and the valves 177, 178, and 179 are electrically connected to the gas flow rate controller 235. The MFCs 183, 184, and 185 are each configured to control the flow rate of a gas to be supplied to reach a desired level at a desired timing.

Although in the first embodiment, it has been described above that the gas supply pipe 232 is divided into three parts at the upstream side, the present invention is not limited thereto. For example, a gas supply pipe may be individually installed for each of gas supply sources, or gas supply pipes having different lengths may be installed for respective substrate retaining regions for processing substrates, or a combination thereof may be used. Also, gas supply holes formed in a gas supply pipe to supply a gas may be a multi-hole nozzle in which gas supply holes are formed at intervals at which wafers are stacked, or a buffer chamber may be installed to regulate the supply of a gas.

A vacuum exhaust device 246 such as a vacuum pump is connected to a downstream side of the gas exhaust pipe 231 via a pressure system (pressure sensor) serving as a pressure detector and an automatic pressure control (APC) value 242 serving as a pressure adjustor. The pressure system and the APC valve 242 are electrically connected to the pressure controller 236. The pressure controller 236 is configured to control a pressure in the process chamber 201 to be a desired pressure at a desired timing by controlling the degree of openness of the APC valve 242 based on a pressure value detected by the pressure system.

A seal cap 219 serving as a furnace port lid is installed below the manifold 209 to air-tightly seal a low end opening in the manifold 209. The seal cap 219 is formed of, for example, stainless steel and has a disk shape. An O-ring 301 serving as a seal member that abuts a lower end of the manifold 209 is installed on a top surface of the seal cap 219. A rotary mechanism 254 is installed on the seal cap 219. A rotary shaft 255 of the rotary mechanism 254 is connected to the boat 217 while passing through the seal cap 219, and the rotary mechanism 254 is configured to rotate the wafer 200 by rotating the boat 217. The seal cap 219 is configured to be vertically moved by a lifting motor 248 which is a lifting mechanism installed at an external side of the process furnace 202 as will be described below. By using the seal cap 219, the boat 217 may be loaded into/unloaded from the process chamber 201. The rotary mechanism 254 and the lifting motor 248 are electrically connected to the driving controller 237 and are configured to perform a desired operation at a desired timing.

A temperature sensor (not shown) serving as a temperature detector is installed near the heater 206 to detect temperature in the process chamber 201. The heater 206 and the temperature sensor are electrically connected to the temperature controller 238. The temperature in the process chamber 201 is controlled to have a desired temperature distribution at a desired timing by controlling electric power to be supplied to the heater 206, based on temperature information detected by the temperature sensor.

In the process furnace 202, a first process gas is supplied from the first gas supply source 180, the flow rate of the first process gas is controlled by the MFC 183, and the controlled first process gas is supplied into the process chamber 201 by the gas supply pipe 232 via the valve 177. A second process gas is supplied from the second gas supply source 181, the flow rate of the second process gas is controlled by the MFC 184, and the controlled second process gas is supplied into the process chamber 201 by the gas supply pipe 232 via the valve 178. A third process gas is supplied from the third gas supply source 182, the flow rate of the third process gas is controlled by the MFC 185, and the controlled third process gas is supplied into the process chamber 201 via the valve 179 by the gas supply pipe 232. Also, a gas remaining in the process chamber 201 is exhausted from the process chamber 201 by the vacuum exhaust device 246 such as vacuum pump connected to the gas exhaust pipe 231.

A low substrate 245 is installed at an external surface of the sub housing 119. On the low substrate 245, a guide shaft 264 coupled to the platform 249 and a ball thread 244 engaged with the platform 249 are installed. A upper substrate 247 is installed on upper surfaces of the guide shaft 264 and the ball thread 244 installed on the low substrate 245. The ball thread 244 is rotated by the lifting motor 248 installed on the upper substrate 247. The platform 249 is configured to be moved upward/downward by rotating the ball thread 244.

A hollow lifting shaft 250 is vertically installed on the platform 249, and the platform 249 and the lifting shaft 250 are air-tightly coupled to each other. The lifting shaft 250 is configured together with the platform 249. The lifting shaft 250 passes through a ceiling plate 251 of the sub housing 119. A through-hole of the ceiling plate 251 which the lifting shaft 250 passes through is spacious enough not to contact the lifting shaft 250. Bellows 265 that are hollow elastic bodies having elastic properties are installed between the sub housing 119 and the platform 249 to cover the periphery of the lifting shaft 250 so that the sub housing 119 can be maintained air-tight. The bellows 265 has sufficient elastic properties corresponding to a lifting degree of the platform 249, and internal diameters of the bellows 265 are much greater than an outer shape of the lifting shaft 250 so as not to elastically contact the lifting shaft 250.

A lifting substrate 252 is horizontally fixed on a lower end of the lifting shaft 250. A driver cover 253 is air-tightly installed on a lower end of the lifting substrate 252 via a seal member such as an O-ring. The lifting substrate 252 and the driver cover 253 form a driver storage case 256 together. Due to this structure, the inside of the driver storage case 256 is isolated from an atmosphere in the sub housing 119.

Also, the rotary mechanism 254 of the boat 217 is installed in the driver storage case 256, and the periphery of the rotary mechanism 254 is cooled by a cooling mechanism 257.

A power supply cable 258 passes through a hollow portion of the lifting shaft 250 starting from the lifting shaft 250 and is then drawn and connected to the rotary mechanism 254. A cooling channel 259 is formed at each of the cooling mechanism 257 and the seal cap 219. The cooling channel 259 is connected to a cooling water pipe 260 via which cooled water is supplied, and passes through the hollow portion of the lifting shaft 250 starting from an upper end of the lifting shaft 250.

By driving the lifting motor 248 to rotate the ball thread 244, the driver storage case 256 is moved upward/downward via the platform 249 and the lifting shaft 250.

When the driver storage case 256 is moved upward, the seal cap 219 that is air-tightly installed on the lifting substrate 252 closes a furnace port which is an aperture unit of the process furnace 202 to cause a state in which the wafer 200 can be processed. When the driver storage case 256 is moved downward, the boat 217 is moved downward together with the seal cap 219 to cause a state in which the wafer 200 can be unloaded to the outside.

Each of the gas flow rate controller 235, the pressure controller 236, the driving controller 237, and the temperature controller 238 includes the manipulation unit and the I/O unit, and is electrically connected to the main controller 239 configured to control the entire substrate processing apparatus 100. The gas flow rate controller 235, the pressure controller 236, the driving controller 237, the temperature controller 238, and the main controller 239 collectively form the controller 240.

Substrate Processing Process

Figure 4A:
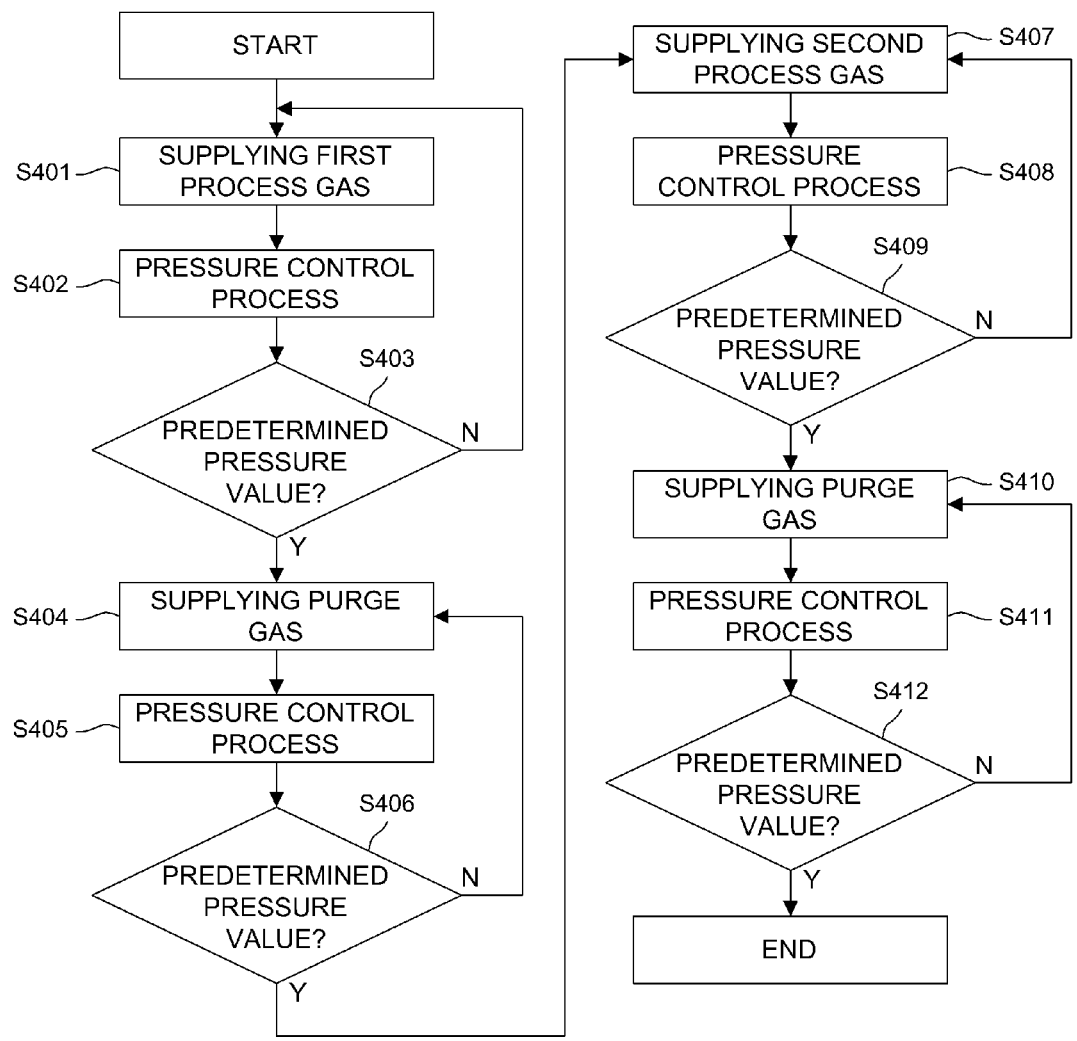
FIG. 4A is a flowchart showing a substrate processing process according to an embodiment of the present invention.
Figure 4B:
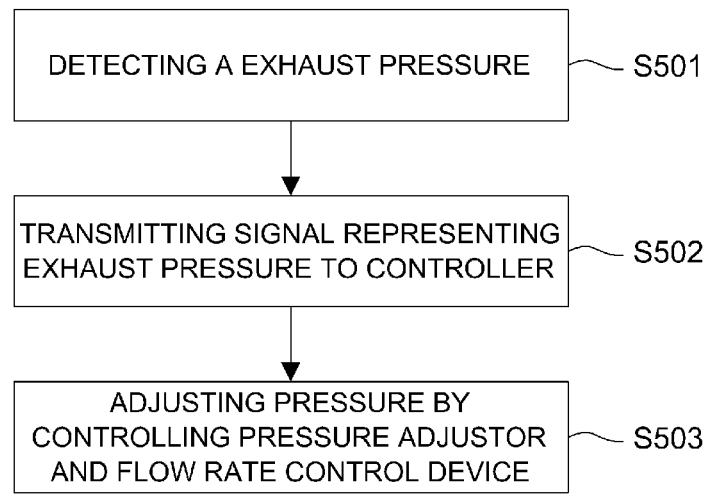
FIG. 4B is a flowchart showing a pressure control process in detail.
Figure 4C:
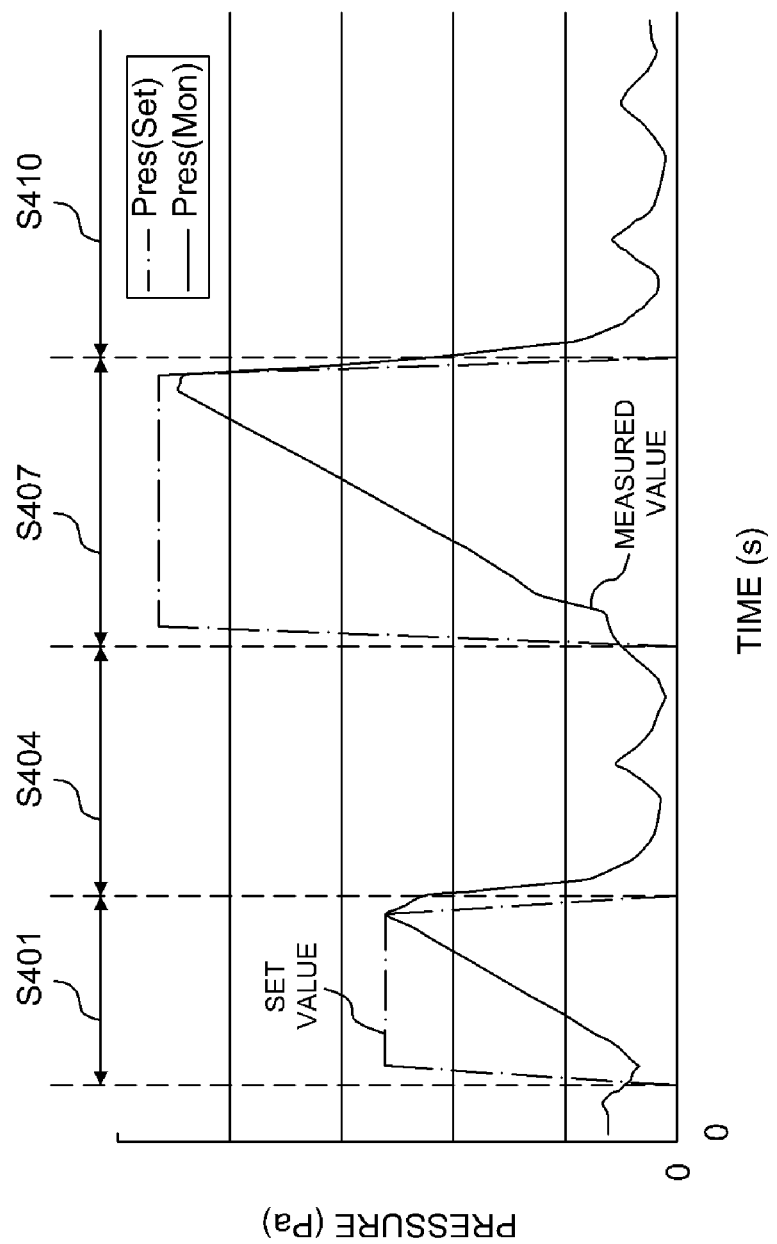
FIG. 4C is a graph comparing a set pressure value and a value obtained by measuring a pressure in a process furnace of a substrate processing apparatus according to an embodiment of the present invention.

Next, a substrate processing process of forming a predetermined film on the wafer 200 using the substrate processing apparatus 100 described above will now be described with reference to FIGS. 3 through 4C. FIG. 4A is a flowchart illustrating a substrate processing process according to an embodiment of the present invention, and FIG. 4B is a flowchart illustrating a pressure control process in detail. FIG. 4C is a graph comparing a set pressure value and a value obtained by measuring a pressure in a process furnace of a substrate processing apparatus according to an embodiment of the present invention.

In the present embodiment, the substrate processing process will be described. In the following, a gas supplied from the first gas supply source 180 will be referred to as a first source gas (a first process gas) for forming a first film, a gas supplied from the second gas supply source 181 will be referred to as a second source gas (a second process gas) for forming a second film, and a gas supplied from the third gas supply source 182 will be referred to as a purge gas for purging an atmosphere in the process furnace 202. However, the present invention is not limited thereto, and for example, an inert gas may be supplied as a carrier gas from the second gas supply source 181, and an additional gas supply source may be used to supply an etching gas to perform etching.

In the present embodiment, examples of a process gas supplied from a gas supply source may include a silicon-containing gas containing a silicon element (e.g., $SiH_4$, $Si_2H_6$, $Si_3H_8$, $SiCl_4$, $Si_2Cl_6$, $SiHCl_3$, $SiH_2Cl_2$, etc.), a germanium-containing gas containing a germanium element (e.g., $GeH_4$, $GeCl_4$, etc.), a carbon-containing gas containing a carbon element (e.g., $C_3H_8$), and an amine-based gas containing a carbon element and a nitrogen element (e.g., ethylamine, triethylamine, methylamine, propylamine, isopropylamine, butylamine, isobutylamine, etc.). Similarly, in the present embodiment, examples of an inert gas supplied from a gas supply source include nitrogen ($N_2$) gas, and a rare gas such as Ar gas, He gas, Ne gas, and Xe gas. Also, examples of a cleaning gas include a chlorine-containing gas containing a chlorine element, a fluorine-containing gas containing a fluorine element, e.g., chlorine ($Cl_2$) gas, hydrogen chloride (HCl), $ClF_3$, etc.

When the boat 217 retaining a predetermined number of wafers 200 is loaded into the process furnace 202, the heater 206 heats the inside of the process furnace 202 to a predetermined substrate process temperature, under control of the temperature controller 238.

When the inside of the process furnace 202 is heated to the predetermined substrate process temperature, the first source gas is supplied by the first gas supply source 180 into the process furnace 202 via the valve 177 for a predetermined period of time until an inside pressure of the process furnace 202 is a predetermined pressure while the flow rate of the first source gas is controlled by the MFC 183 under control of the gas flow rate controller 235 (S401 through S403).

First, the first process gas is supplied (S401), and the pressure control process is performed (S402). Thereafter, the exhaust pressure is checked to determine whether the exhaust pressure is equal to a predetermined pressure (S403). If the exhaust pressure is determined to be not equal to the predetermined pressure in step S403, the process returns to step S401. If the exhaust pressure is determined to be equal to the predetermined pressure in step S403, the process proceeds to step S404.

As shown in FIG. 4B, the exhaust pressure is detected (S501), a signal representing the detected exhaust pressure is transmitted to the controller (S502), and the pressure is adjusted by controlling the pressure adjustor and the flow rate control device (S503) in the pressure control process of step S402.

When an inside pressure of the process furnace 202 reaches the predetermined pressure through the supply of the first source gas, the valve 177 is closed to suspend the supply of the first source gas, and the purge gas is supplied by the third gas supply source 182 (S404). In addition, the pressure control process shown in FIG. 4B is performed (S405), and the exhaust pressure is checked to determine whether the exhaust pressure is equal to the predetermined pressure (S406). If the exhaust pressure is determined to be not equal to the predetermined pressure in step S406, the process returns to step S404. If the exhaust pressure is determined to be equal to the predetermined pressure in step S406, the process proceeds to step S407. In steps S404 through S406, the purge gas is supplied via the valve 179 after the flow rate of the purge gas is controlled by the MFC 185. At the same time, the first source gas remaining in the process furnace 202 is purged for a predetermined period of time while an exhaust amount is controlled by the APC valve 242 under control of the pressure controller 236.

After the first source gas is purged for the predetermined period of time, the valve 179 is closed to suspend the supply of the purge gas, and the second source gas is then supplied via the valve 178 for a predetermined period of time until the inside of the process furnace 202 has a predetermined pressure while the flow rate of the second source gas supplied from the second gas supply source 181 is controlled by the MFC 184 under control of the gas flow rate controller 235 (S407 through S409).

First, the second process gas is supplied (S407), and the pressure control process shown in FIG. 4B is performed (S408). Thereafter, the exhaust pressure is checked to determine whether the exhaust pressure is equal to the predetermined pressure (S409). If the exhaust pressure is determined to be not equal to the predetermined pressure in step S409, the process returns to step S407. If the exhaust pressure is determined to be equal to the predetermined pressure in step S409, the process proceeds to step S410.

When the inside pressure of the process furnace 202 reaches the predetermined pressure through the supply of the second source gas, the valve 178 is closed to suspend the supply of the second source gas, the controlled purge gas is then supplied by the third gas supply source 182 via the valve 179 while the flow rate of the purge gas is controlled by the MFC 185 (S410). In addition, the pressure control process shown in FIG. 4B is performed (S411), and the exhaust pressure is checked to determine whether the exhaust pressure is equal to the predetermined pressure (S412). If the exhaust pressure is determined to be not equal to the predetermined pressure in step S412, the process returns to step S410. If the exhaust pressure is determined to be equal to the predetermined pressure in step S412, the supply of the purge gas is terminated. In steps S410 through S412, the second source gas remaining in the process furnace 202 is purged for a predetermined period of time while an exhaust amount is controlled by the APC valve 242 under control of the pressure controller 236.

A film having a desired thickness is formed on the wafer 200 by repeating a cycle including the steps S401 through S412 a predetermined number of times. When needed, an etching gas (cleaning gas) may be further supplied.

Figure 5:
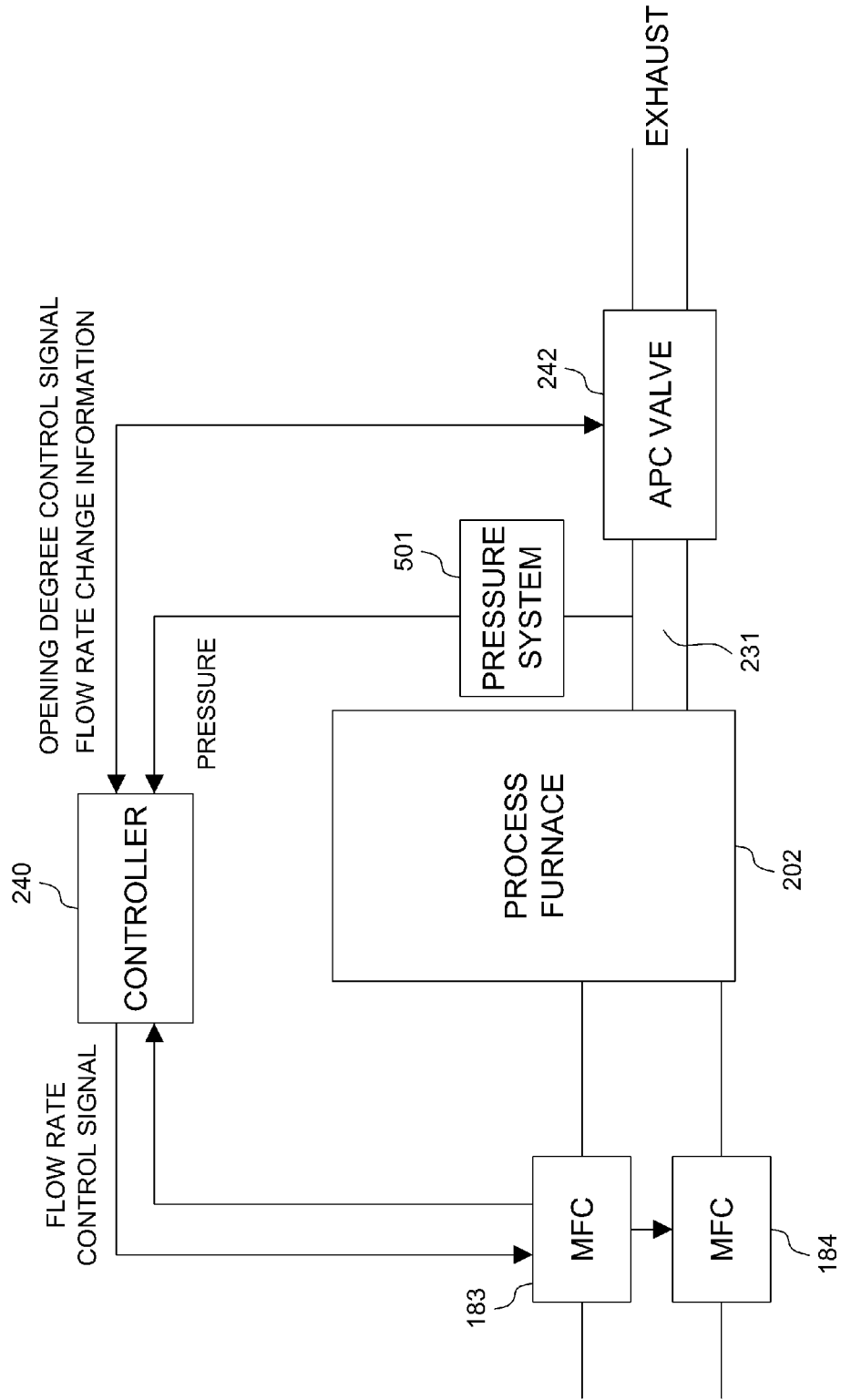
FIG. 5 is a schematic view showing the structure of the periphery of a substrate processing apparatus according to an embodiment of the present invention.
Figure 6:
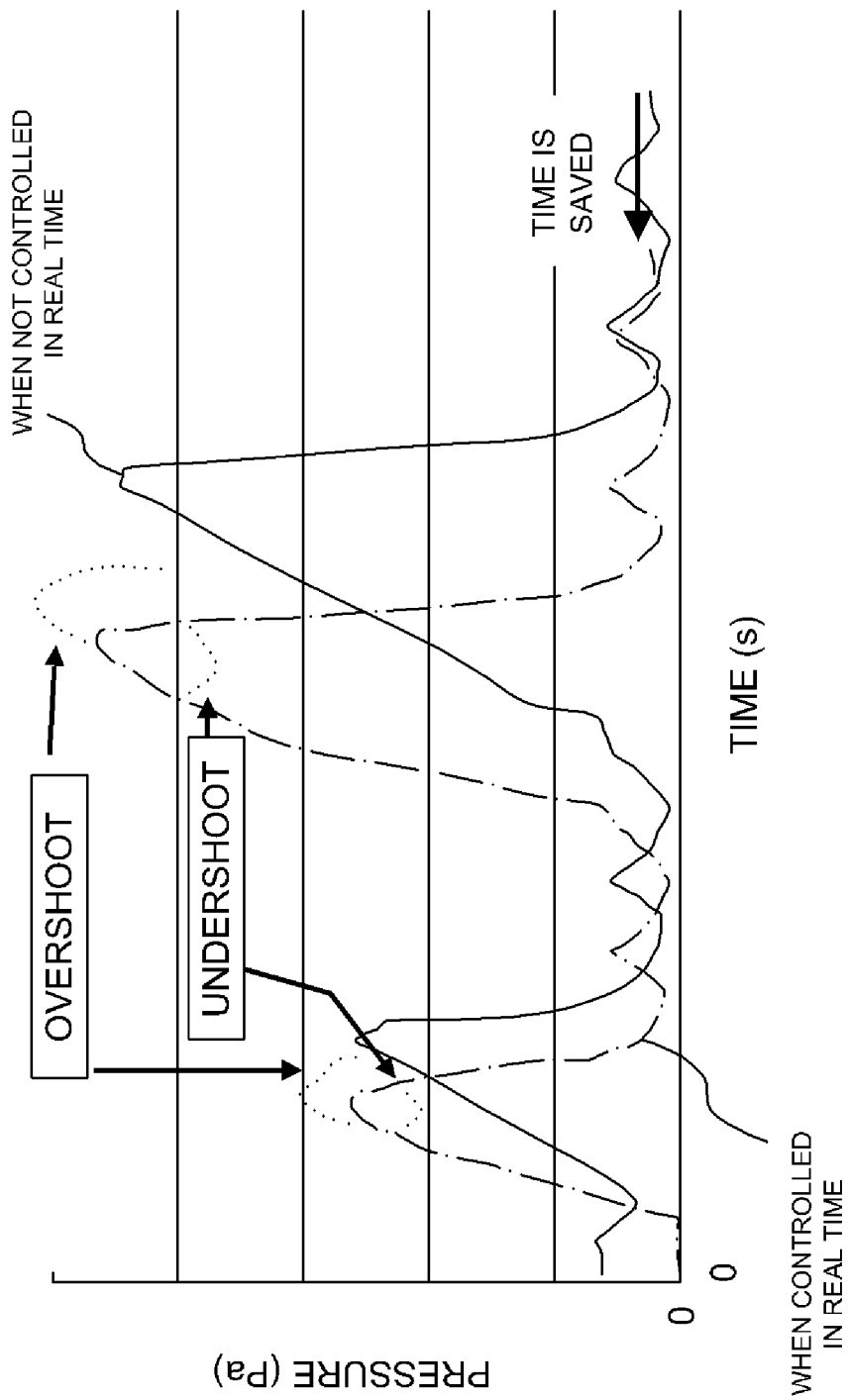
FIG. 6 is a graph showing a variation in pressure in a process furnace of a substrate processing apparatus versus time, according to an embodiment of the present invention.

A case in which the pressure in the process furnace is controlled in real time using the substrate processing process described above will now be described with reference to FIGS. 5 and 6. FIG. 5 is a schematic view showing the structure of the periphery of a substrate processing apparatus according to an embodiment of the present invention. FIG. 6 is a graph showing a variation in pressure in a process furnace of a substrate processing apparatus versus time, according to an embodiment of the present invention.

In the present embodiment, a pressure system 501 is installed at a gas exhaust pipe 231 between the process furnace 202 and an APC valve 242. The pressure system 501 measures an exhaust pressure and feeds back a measured pressure value to a controller 240. The controller 240 transmits a flow rate control signal to MFCs 183, 184, and 185 and transmits an opening degree control signal and flow rate change information to the APC valve 242, based on the measured pressure value received from the system 501. Thus, the pressure in a process furnace 202 may be controlled in real time.

Specifically, for example, during the supplying of the first source gas (S401), the controller 240 transmits a flow rate control signal instructing to increase a gas supply flow rate to the MFC 183 so as to increase the supply flow rate of the first source gas, based on the pressure value received from the pressure system 501, right after the supply of the first source gas starts. When the pressure in the process furnace 202 approximates a predetermined pressure value, the controller 241 receiving the measured pressure value from the pressure system 501 transmits a flow rate control signal instructing to reduce a gas supply flow rate to the MFC 183. Then, the MFC 183 controls the supply of the first source gas to maintain the pressure in the process furnace 202 at a constant level.

During the purging of the first source gas (S402), the controller 240 transmits a flow rate control signal instructing to increase the gas supply flow rate to the MFC 185 so as to increase the supply flow rate of the first source gas, based on the measured pressure value received from the pressure system 501, right after the purging of the first source gas starts. Also, the controller 240 transmits an opening degree control signal and a flow rate change signal to the APC valve 242 so as to increase an exhaust amount. When the pressure in the process furnace 202 is lowered to the predetermined value or less, the controller 240 transmits a flow rate control signal to the MFC 185 to change a supply rate of the purge gas to an appropriate level and transmits an opening degree control signal and flow rate change information to the APC valve 242 so as to reduce an exhaust amount, based on the measured pressure value received from the pressure system 501. Here, the supplying of the second source gas (S403) or the purging of the second source gas (S404) is controlled similarly. The present invention is, however, not limited thereto and the above control methods may be modified according to a purpose or conditions.

By controlling the supply rate of a gas and an exhaust amount of a gas from the process furnace by reflecting the pressure value measured by the pressure system into the controller in real time as described above, a timing when the supply flow rate of a gas is changed under control of the MFCs 183, 184, and 185 and a timing when an exhaust amount is changed under control of the APC valve 242 may be synchronized with each other. Thus, the occurrence of an overshoot or an undershoot may be suppressed. That is, the occurrence of the overshoot or the undershoot may be suppressed using an MFC and an APC valve in association with each other.

Effects of the First Embodiment

According to the present embodiment, the following one or more effects may be derived.

According to the present embodiment, a timing when the supply flow rate of a gas is changed under control of an MFC and a timing when an exhaust amount is changed under control of an APC valve may be synchronized with each other by reflecting a pressure value measured by a pressure system in a controller in real time and controlling the supply rate of a gas and a gas exhaust amount from a reaction furnace. Thus, the occurrence of an overshoot or an undershoot may be suppressed.

Also, according to the present embodiment, a process time per cycle in a substrate processing process may be reduced by shortening a time needed for the pressure in a process furnace to reach a predetermined pressure value in the substrate processing process. As a result, the throughput of the substrate processing apparatus can be improved.

Second Embodiment

A second embodiment of the present invention will now be described.

The first embodiment has been described above with respect to a batch-type vertical substrate processing apparatus, whereas the second embodiment will be described with respect to a single-wafer-type substrate processing apparatus.

Figure 7:
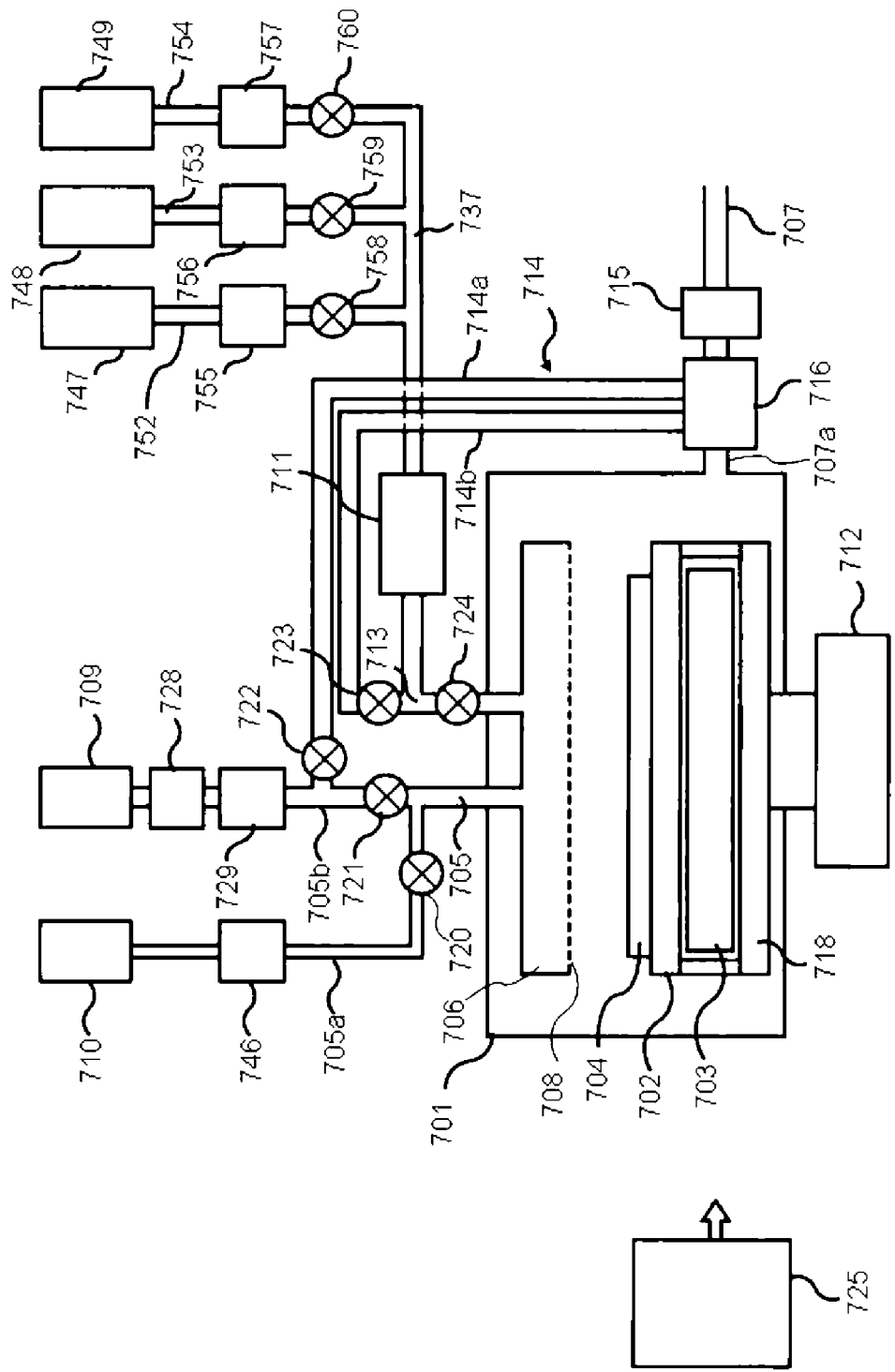
FIG. 7 is a schematic view showing an example of a substrate processing apparatus according to a second embodiment of the present invention.

FIG. 7 is a schematic view of an example of a substrate processing apparatus which is a single-wafer-type substrate processing apparatus according to a second embodiment of the present invention. As illustrated in FIG. 7, a hollow heater unit 718, an upper opening of which is covered with a susceptor 702 is installed in a process furnace 701. In the heater unit 718, a heater 703 is installed, and a wafer 704 placed on the susceptor 702 is heated by the heater 703. The wafer 704 placed on the susceptor 702 may be, for example, a semiconductor silicon wafer, a glass substrate, etc.

In addition to the process furnace 701, a substrate rotating unit 712 is installed. The substrate rotating unit 712 is configured to rotate the heater unit 718 in the process furnace 701 so as to rotate the wafer 704 placed on the susceptor 702. The wafer 704 is rotated to rapidly and regularly perform substrate processing in a plane of the wafer 704 during a film forming process or a modifying process.

A shower head 706 with a plurality of holes 708 is installed above the susceptor 702 in the process furnace 701. The shower head 706 is commonly connected to a source supply pipe 705 via which a film-forming gas is supplied and a radical supply pipe 713 via which a radical is supplied so that the film-forming gas or the radical may be sprayed from shower head 706 in the form of showers into the process furnace 701. The shower head 706 is configured as a supply port via which a film-forming gas is supplied onto the wafer 704 during the film-forming process and a radical is supplied onto the wafer 704 during the modifying process.

Outside the process furnace 701, a film-forming source supply unit 709 configured to supply an organic liquid source as a film-forming source, a liquid flow rate controller 728 which is a flow rate control unit configured to control the supply flow rate of liquid of a film-forming source, and a vaporizer 729 configured to vaporize the film-forming source are installed. Further, outside the process furnace 701, an inert gas supply unit 710 configured to supply an inert gas as a non-reacted gas or a purge gas and an MFC 746 serving as a flow rate control unit configured to control the supply flow rate of an inert gas are installed. For example, when a $HfO_2$ film is formed on the wafer 200, an organic material such as Hf-(MMP)4 is used as a film-forming source. Also, Ar, He, $N_2$, or the like is used as an inert gas. A source supply pipe 705 connected to the shower head 706 is installed by unifying a source gas supply pipe 705b installed at the film-forming source supply unit 709 and an inert gas supply pipe 705a installed at the inert gas supply unit 710. The source supply pipe 705 is configured to supply a mixture gas of the third source gas and an inert gas to the shower head 706 during the film-forming process of forming a desired film on the wafer 704. Valves 721 and 720 are installed at the source gas supply pipe 705b and the inert gas supply pipe 705a, respectively. By opening/closing the valves 721 and 720, the supply of the mixture gas of the third source gas and the inert gas may be controlled.

Also, outside the process furnace 701, a reactant activating unit 711 (remote plasma unit) functioning as a plasma source for forming a radical as a reactant by activating a gas using plasma is installed. When an organic material such as Hf-(MMP)4 is used as a source of a radical used in the modifying process, for example, an oxygen radical is preferably used. This is because impurities such C or H may be efficiently removed right after a $HfO_2$ film is formed using the oxygen radical. Also, a $ClF_3$ radical is preferably used as a radical to be used during a cleaning process. In the modifying process, a treatment of oxidizing a film in an oxygen radical atmosphere in which, for example, an oxygen-containing gas ($O_2$, $N_2O$, NO, etc.) is dissolved using plasma, is referred to as a remote plasma oxidation (RPO) treatment.

A gas supply pipe 737 is installed at an upstream side of the reactant activating unit 711. The gas supply pipe 737 is connected to a fourth source gas supply unit 747 configured to supply a fourth source gas, a fifth source gas supply unit 748 configured to supply a fifth source gas which is a gas generating plasma, and a sixth source gas supply unit 749 configured to supply a sixth source gas via supply pipes 752, 753, and 754, respectively, and is configured to supply a gas used during the modifying process and a gas used during the cleaning process to the reactant activating unit 711. MFCs 755, 756, and 757 each serving as a flow rate control unit for controlling the supply flow rate of a gas are installed at the fourth source gas supply unit 747, the fifth source gas supply unit 748, and the sixth source gas supply unit 749, respectively. Valves 758, 759, and 760 are installed at the supply pipes 752, 753, and 754, respectively, and the supply of the fourth to sixth source gases may be controlled by opening/closing the valves 758, 759, and 760.

A radical supply pipe 713 connected to the shower head 706 is installed at a downstream side of the reactant activating unit 711, and is configured to supply an oxygen radical or a fluorine chloride radical to the shower head 706 in the modifying process or the cleaning process. Also, the radical supply pipe 713 is configured to control the supply of a radical by installing a valve 724 at the radical supply pipe 713 and opening/closing the valve 724.

An exhaust port 707a is installed in the process furnace 701. The exhaust port 707a is connected to an exhaust pipe 707 that communicates with a waste gas scrubber (not shown). A material collecting trap 716 is installed at the exhaust pipe 707 to collect the film-forming source. The material collecting trap 716 is commonly used in the film-forming process and the modifying process. An APC valve 715 is installed at a downstream side of the material collecting trap 716 and controls an exhaust amount to adjust the pressure in the process furnace 701. The exhaust port 707a and the exhaust pipe 707 form an exhaust line together.

Also, a source gas bypass pipe 714a and a radical bypass pipe 714b (which may also be collectively referred to simply as a bypass pipe 714) connected to the material collecting trap 716 installed at the exhaust pipe 707 are installed at the source gas supply pipe 705b and the radical supply pipe 713, respectively. Valves 722 and 723 are installed at the source gas bypass pipe 714a and the radical bypass pipe 714b, respectively. When a film-forming gas is supplied onto the wafer 704 in the process furnace 701 by opening/closing the valves 722 and 723 in the film-forming process, the supply of the radial used in the modifying process is not suspended and the radical is beforehand exhausted via the radical bypass pipe 714b and the material collecting trap 716 to bypass the process furnace 701. Also, when a radical is supplied onto the wafer 704 in the modifying process, the supply of the film-forming gas used in the film-forming process is not suspended and the radical is exhausted via the source gas bypass pipe 714a and the material collecting trap 716 to bypass the process furnace 701.

Also, a controller 725 is installed to control the film-forming process of forming a desired film on the wafer 704 in the process furnace 701 and the modifying process of removing impurities such as a specific element contained in the desired film formed in the film-forming process according to a plasma treatment using the reactant activating unit 711, to be continuously and repeatedly performed a plurality of times by opening/closing the valves 720 to 724.

Here, the controller 725 includes the gas flow rate controller 235, the pressure controller 236, the driving controller 237, the temperature controller 238, and the main controller 239 as in the first embodiment, and is electrically connected to the liquid flow rate controller 728, the MFCs 746, 755, 756, and 757, and the APC valve 715.

Figure 8:
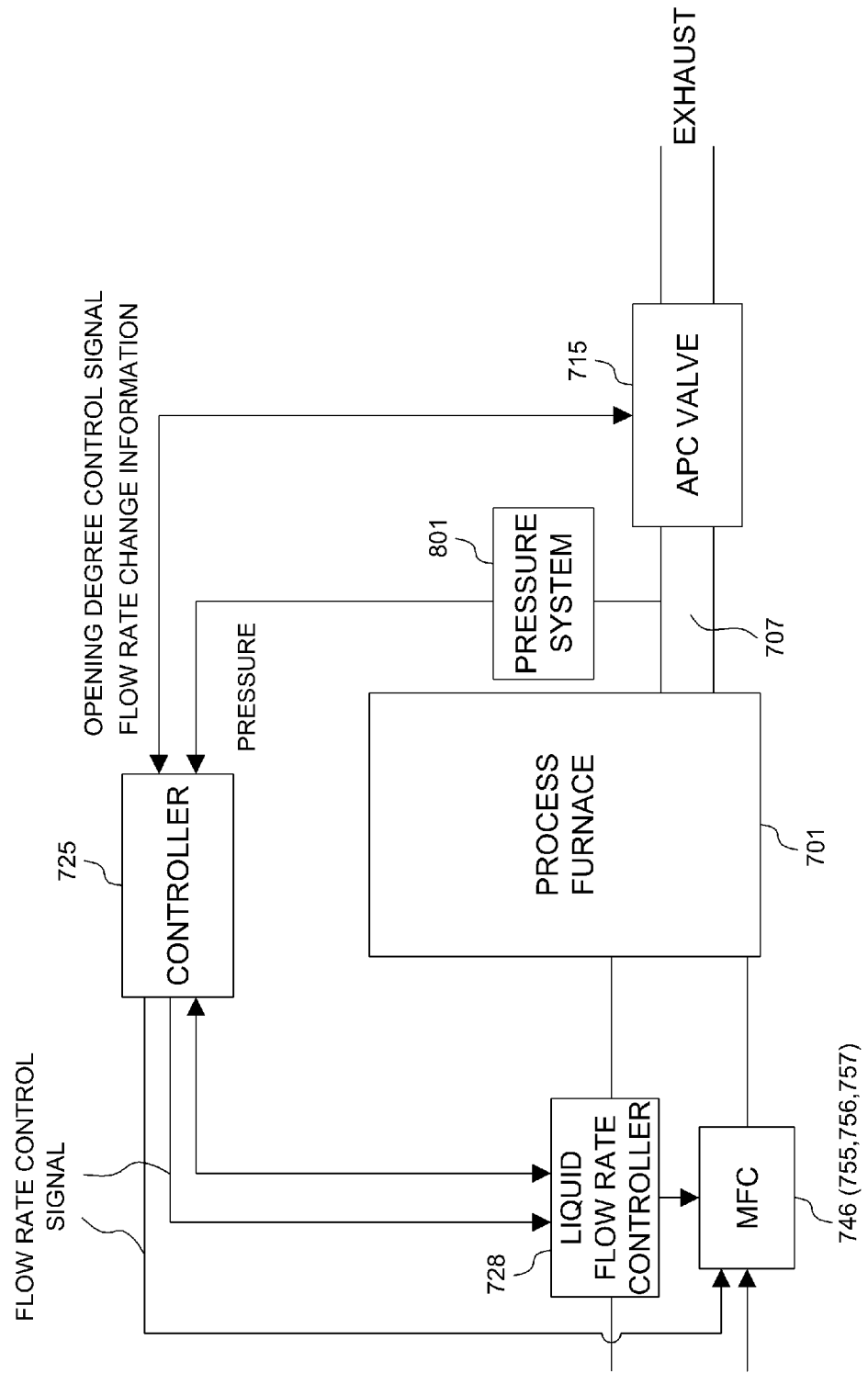
FIG. 8 is a schematic view showing the structure of the periphery of a substrate processing apparatus according to the second embodiment of the present invention.
Figure 9:
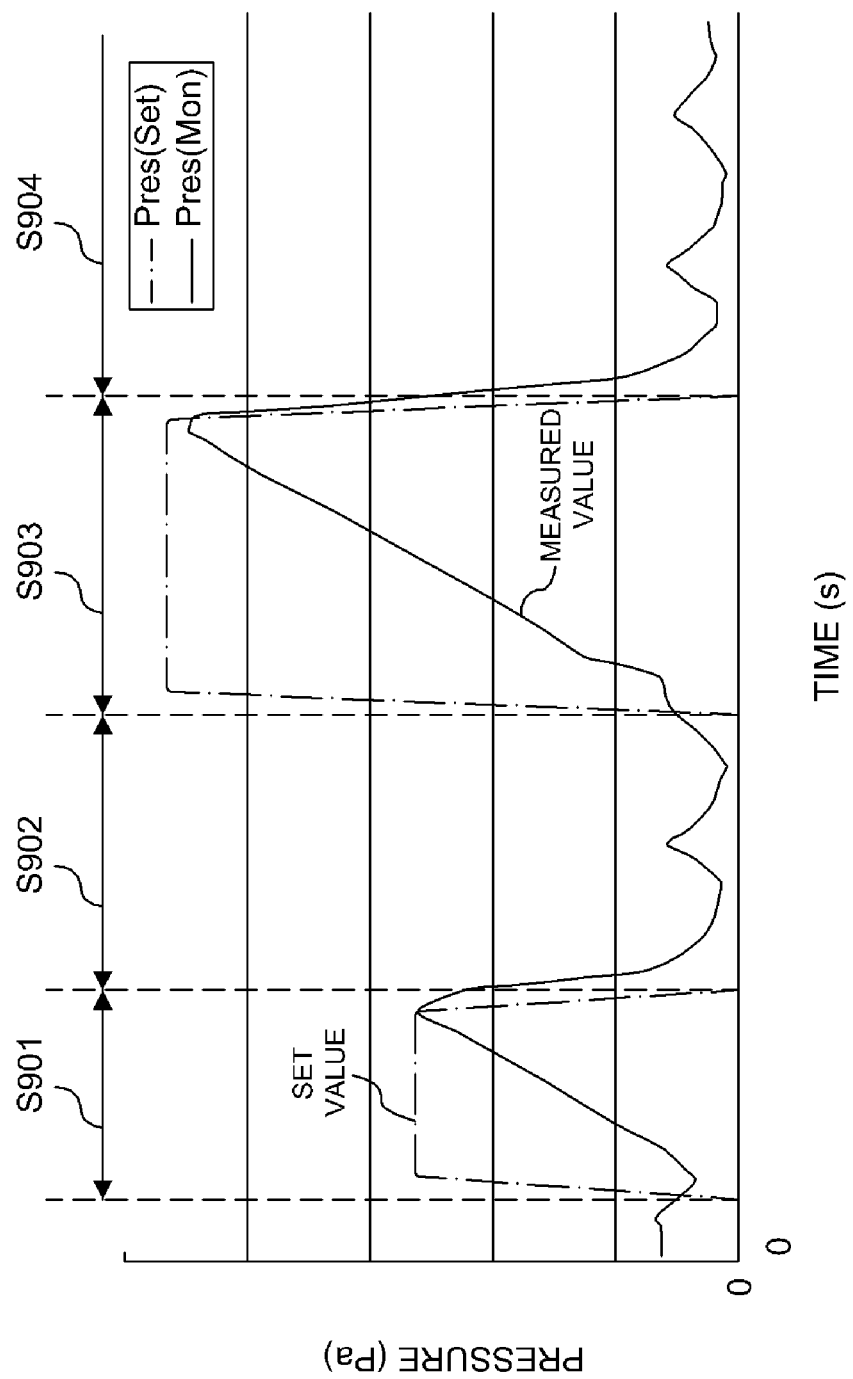
FIG. 9 is a graph comparing a set pressure value and a value obtained by measuring a pressure in a process furnace of a substrate processing apparatus according to the second embodiment of the present invention.

Pressure control according to the second embodiment will now be described with reference to FIGS. 8 and 9. FIG. 8 is a schematic view of the structure of the periphery of a substrate processing apparatus according to the second embodiment of the present invention. FIG. 9 is a graph comparing a set pressure value and a value obtained by measuring a pressure in a process furnace of a substrate processing apparatus according to the second embodiment of the present invention. The controller 725 may control a gas flow rate by transmitting a flow rate control signal to the liquid flow rate controller 728 and the MFCs 746, 755, 756, and 757, and maintain the pressure in the process furnace 701 at a desired level by receiving a measured pressure value from a pressure system 801 installed between the furnace 701 and an APC valve 715, and transmitting an opening degree control signal and flow rate change information to the APC valve 715.

In other words, the flow rate of a liquid source supplied from the film-forming source supply unit 709 is controlled by the liquid flow rate controller 728, and the controlled liquid source is vaporized by the vaporizer 729. The vaporized source gas is continuously supplied onto the wafer 704 via the shower head 706 until the pressure in the process furnace 701 has a predetermined pressure value (S901). The pressure in the process furnace 701 reaches the predetermined pressure value by supplying the vaporized source gas, an inert gas is supplied from the inert gas supply unit 710, while gas inside the process furnace 701 is exhausted via the gas exhaust pipe 707 installed at the process furnace 701 when a predetermined period of time passes and the vaporized source gas supplied into the process furnace 701 is purged (S902). When the vaporized source gas is purged, a gas supplied from the fourth source gas supply unit 747 is activated by the reactant activating unit 711 and is supplied as a gas containing a radical into the process furnace 701 via the shower head 706 until the inside of the process furnace 701 has the predetermined pressure value (S903). When a predetermined period of time passes after the inside of the process furnace 701 has the predetermined pressure value due to the gas containing the radical, an inert gas is supplied from the inert gas supply unit 710 while gas inside the process furnace 701 is exhausted again via the gas exhaust pipe 707 and the gas containing the radical supplied into the process furnace 701 is purged (S904).

In the second embodiment, in the supplying of the first source gas (S901), the controller 725 transmits a flow rate control signal to the liquid flow rate controller 728 so as to increase the supply flow rate of a source gas at a high flow rate, based on the measured pressure value received from the pressure system 801, right after the supply of the first source gas starts, as in the first embodiment. When the pressure in the process furnace 701 approximates the predetermined pressure value, the controller 725 receiving the measured pressure value from the pressure system 801 transmits a flow rate control signal to the liquid flow rate controller 728 so as to reduce the gas supply rate. Accordingly, the supply rate of the first source gas is controlled, thereby maintaining the pressure in the process furnace 701 at a constant level.

Also, in the purging of the first source gas (S902), the controller 725 transmits a flow rate control signal to the MFC 746 so as to increase the supply flow rate of the inert gas, and transmits an opening degree control signal and a flow rate change signal to the APC valve 715 so as to increase an exhaust amount, based on the measured pressure value received from the pressure system 801, right after the purging of the first source gas starts. When the pressure in the process furnace 701 is lowered to about a predetermined value, the controller 725 transmits a flow rate control signal to the MFC 746 so as to change the supply rate of the purge gas to an appropriate value, and transmits an opening degree control signal and flow rate change information to the APC valve 715 so as to reduce an exhaust amount, based on the measured pressure value received from the pressure system 801. The supplying of the second source gas (S903) or the purging of the second source gas (S904) is controlled similarly. However, the present invention is not limited thereto and the above control methods may be modified according to a purpose or conditions.

Effects of the Second Embodiment

According to the second embodiment described above, the same effects as in the first embodiment may be provided.

Other Embodiments of the Present Invention

Although embodiments of the present invention have been described above in detail, the present invention is not limited thereto and may be embodied in many different forms within the scope of the present invention.

For example, the first embodiment of the present invention has been described with respect to a batch-type vertical apparatus, but a batch-type transverse apparatus may be used or a vertical or transverse substrate processing apparatus having a plurality of process furnaces may be used.

Similarly, although in the second embodiment, a substrate processing apparatus capable of performing substrate processing using plasma has been described above, the present invention is not limited thereto. Alternatively, a single-wafer-type substrate processing apparatus that does not use plasma may be used. Also, the single-wafer-type substrate processing apparatus may be a single-wafer-type apparatus configured to process one wafer at a time, or a multi-wafer type apparatus configured to process wafers in batches.

According to the present invention, a method of manufacturing a semiconductor device, a substrate processing method, and a substrate processing apparatus, which are capable of suppressing a decrease in throughput when a substrate has a large diameter can be provided.

Additional Exemplary Embodiments of the Present Invention

Additional exemplary embodiments of the present invention will now be described.

Supplementary Note 1

An aspect of the present invention provides a method of manufacturing a semiconductor device using a substrate processing apparatus comprising a process chamber configured to process a substrate, a first process gas supply unit configured to supply a first process gas for forming a first film on the substrate, a second process gas supply unit configured to supply a second process gas for forming a second film on the first film, a purge gas supply unit configured to supply a purge gas for purging an atmosphere in the process chamber, a flow rate control device configured to control flow rates of the first process gas, the second process gas and the purge gas, an exhaust device configured to exhaust the process chamber, a pressure detector installed at the exhaust device to detect an exhaust pressure, a pressure adjustor configured to adjust an inside pressure of the process chamber and a controller connected to at least the pressure detector, the pressure adjustor and the flow rate control device, and configured to control the pressure adjustor and the flow rate control device based on the exhaust pressure detected by the pressure detector, the method comprising: (a) supplying the first process gas from the first process gas supply unit into the process chamber via the flow rate control device to form the film on the substrate; (b) transmitting a signal representing the exhaust pressure detected by the pressure detector to the controller after the first process gas is supplied into the process chamber; (c) controlling the pressure adjustor and the flow rate control device once the signal is received by the controller such that the exhaust pressure reaches a predetermined pressure; (d) supplying the purge gas from the purge gas supply unit into the process chamber after forming the first film; and (e) supplying the second process gas from the second process gas supply unit into the process chamber via the flow rate control device to form the second film on the first film.

Supplementary Note 2

Another aspect of the present invention provides substrate processing method using a substrate processing apparatus comprising a process chamber configured to process a substrate, a first process gas supply unit configured to supply a first process gas for forming a first film on the substrate, a second process gas supply unit configured to supply a second process gas for forming a second film on the first film, a purge gas supply unit configured to supply a purge gas for purging an atmosphere in the process chamber, a flow rate control device configured to control flow rates of the first process gas, the second process gas and the purge gas, an exhaust device configured to exhaust the process chamber, a pressure detector installed at the exhaust device to detect an exhaust pressure, a pressure adjustor configured to adjust an inside pressure of the process chamber and a controller connected to at least the pressure detector, the pressure adjustor and the flow rate control device, and configured to control the pressure adjustor and the flow rate control device based on the exhaust pressure detected by the pressure detector, the method comprising: (a) supplying the first process gas from the first process gas supply unit into the process chamber via the flow rate control device to form the film on the substrate; (b) transmitting a signal representing the exhaust pressure detected by the pressure detector to the controller after the first process gas is supplied into the process chamber; (c) controlling the pressure adjustor and the flow rate control device once the signal is received by the controller such that the exhaust pressure reaches a predetermined pressure; (d) supplying the purge gas from the purge gas supply unit into the process chamber to purge an inside atmosphere after forming the first film; and (e) supplying the second process gas from the second process gas supply unit into the process chamber via the flow rate control device to form the second film on the first film.

Supplementary Note 3

Yet another aspect of the present invention provides a substrate processing apparatus comprising: a process chamber configured to process a substrate; a first process gas supply unit configured to supply a first process gas for forming a first film on the substrate; a second process gas supply unit configured to supply a second process gas for forming a second film on the first film; a purge gas supply unit configured to supply a purge gas for purging an atmosphere in the process chamber; a flow rate control device configured to control flow rates of the first process gas, the second process gas and the purge gas; an exhaust device configured to exhaust the process chamber; a pressure detector installed at the exhaust device to detect an exhaust pressure; a pressure adjustor configured to adjust an inside pressure of the process chamber; and a controller connected to at least the pressure detector, the pressure adjustor and the flow rate control device and configured to control the pressure adjustor and the flow rate control device based on the exhaust pressure detected by the pressure detector.

What is claimed is:

1. A method of manufacturing a semiconductor device using a substrate processing apparatus comprising a process chamber configured to process a substrate, a first process gas supply unit configured to supply a first process gas for forming a first film on the substrate, a second process gas supply unit configured to supply a second process gas for forming a second film on the first film, a purge gas supply unit configured to supply a purge gas for purging an atmosphere in the process chamber, a flow rate control device configured to control flow rates of the first process gas, the second process gas and the purge gas, an exhaust device configured to exhaust the process chamber, a pressure detector installed at the exhaust device to detect an exhaust pressure, a pressure adjustor configured to adjust an inside pressure of the process chamber and a controller connected to at least the pressure detector, the pressure adjustor and the flow rate control device, and configured to control the pressure adjustor and the flow rate control device based on the exhaust pressure detected by the pressure detector, the method comprising:
(a) supplying the first process gas from the first process gas supply unit into the process chamber via the flow rate control device to form the film on the substrate;
(b) transmitting a signal representing the exhaust pressure detected by the pressure detector to the controller after the first process gas is supplied into the process chamber;
(c) controlling the pressure adjustor and the flow rate control device once the signal is received by the controller such that the exhaust pressure reaches a predetermined pressure;
(d) supplying the purge gas from the purge gas supply unit into the process chamber after forming the first film; and
(e) supplying the second process gas from the second process gas supply unit into the process chamber via the flow rate control device to form the second film on the first film.

2. The method of claim 1, wherein (c) comprises controlling the flow rate control device to reduce the flow rate of the first process gas when the exhaust pressure detected in (b) is equal to or greater than a first pressure.

3. The method of claim 1, further comprising:
(f) detecting an exhaust pressure after the second process gas is supplied into the process chamber;
(g) controlling the flow rate control device to reduce the flow rate of the second process gas when the exhaust pressure detected by (f) is equal to or greater than a second pressure; and
(h) supplying the purge gas into the process chamber.

4. The method of claim 1, wherein the flow rate control device comprises a mass flow controller.

5. The method of claim 1, wherein the pressure adjustor comprises an automatic pressure control valve.

6. A substrate processing method using a substrate processing apparatus comprising a process chamber configured to process a substrate, a first process gas supply unit configured to supply a first process gas for forming a first film on the substrate, a second process gas supply unit configured to supply a second process gas for forming a second film on the first film, a purge gas supply unit configured to supply a purge gas for purging an atmosphere in the process chamber, a flow rate control device configured to control flow rates of the first process gas, the second process gas and the purge gas, an exhaust device configured to exhaust the process chamber, a pressure detector installed at the exhaust device to detect an exhaust pressure, a pressure adjustor configured to adjust an inside pressure of the process chamber and a controller connected to at least the pressure detector, the pressure adjustor and the flow rate control device, and configured to control the pressure adjustor and the flow rate control device based on the exhaust pressure detected by the pressure detector, the method comprising:
(a) supplying the first process gas from the first process gas supply unit into the process chamber via the flow rate control device to form the film on the substrate;
(b) transmitting a signal representing the exhaust pressure detected by the pressure detector to the controller after the first process gas is supplied into the process chamber;
(c) controlling the pressure adjustor and the flow rate control device once the signal is received by the controller such that the exhaust pressure reaches a predetermined pressure;
(d) supplying the purge gas from the purge gas supply unit into the process chamber to purge an inside atmosphere after forming the first film; and
(e) supplying the second process gas from the second process gas supply unit into the process chamber via the flow rate control device to form the second film on the first film.

7. A substrate processing apparatus comprising:
a process chamber configured to process a substrate;
a first process gas supply unit configured to supply a first process gas for forming a first film on the substrate;
a second process gas supply unit configured to supply a second process gas for forming a second film on the first film;
a purge gas supply unit configured to supply a purge gas for purging an atmosphere in the process chamber;
a flow rate control device configured to control flow rates of the first process gas, the second process gas and the purge gas;
an exhaust device configured to exhaust the process chamber;
a pressure detector installed at the exhaust device to detect an exhaust pressure;
a pressure adjustor configured to adjust an inside pressure of the process chamber; and
a controller connected to at least the pressure detector, the pressure adjustor and the flow rate control device and configured to control the pressure adjustor and the flow rate control device based on the exhaust pressure detected by the pressure detector.

8. The substrate processing apparatus of claim 7, wherein the pressure detector is configured to transmit a signal representing the exhaust pressure to the controller by detecting the exhaust pressure, and
the controller is configured to control the pressure adjustor and the flow rate control device based on the signal received from the pressure detector such that the inside pressure of the process chamber reaches a predetermined pressure.

9. The substrate processing apparatus of claim 7, wherein the flow rate control device comprises a mass flow controller.

10. The substrate processing apparatus of claim 7, wherein the pressure adjustor comprises an automatic pressure control valve.

* * * * *